United States Patent [19]

Kawai

[11] Patent Number: 4,751,195

[45] Date of Patent: Jun. 14, 1988

[54] METHOD OF MANUFACTURING A HETEROJUNCTION BIPOLAR TRANSISTOR

[75] Inventor: Hiroji Kawai, Kanagawa, Japan

[73] Assignee: Sony Corporation, Tokyo, Japan

[21] Appl. No.: 66,112

[22] Filed: Jun. 25, 1987

[30] Foreign Application Priority Data

Jun. 26, 1986 [JP] Japan .................. 61-150497

[51] Int. Cl.$^4$ .................. H01L 21/265; H01R 21/20
[52] U.S. Cl. .................. 437/31; 357/34;
357/16; 437/133; 437/228; 148/DIG. 11
[58] Field of Search .................. 357/34, 16; 437/31,
437/133, 228; 148/DIG. 11, DIG. 72

[56] References Cited

PUBLICATIONS

Nagata et al., "A New Self-Aligned Structure AlGaAs/GaAs HBT for High Speed Digital Circuits", Gallium Arsenide and Related Compounds 1985, Proceedings of the Twelfth International Symposium, pp. 589–594, 1986.

Nagata et al., "A New Self-Aligned AlGaAs/GaAs HBT for High Speed Digital Circuits," Electrical & Electronics Abstracts, Sep. 1986, p. 3579.

*Primary Examiner*—Brian E. Hearn
*Assistant Examiner*—Mary Wilczewski
*Attorney, Agent, or Firm*—Hill, Van Santen, Steadman & Simpson

[57] ABSTRACT

A method of manufacturing a heterojunction bipolar transistor in which a collector region, a base region and an emitter region are successively formed on a compound semiconductor substrate, forming the emitter region by epitaxial growth in a concave portion formed on an electrode leading region at the base region.

5 Claims, 4 Drawing Sheets

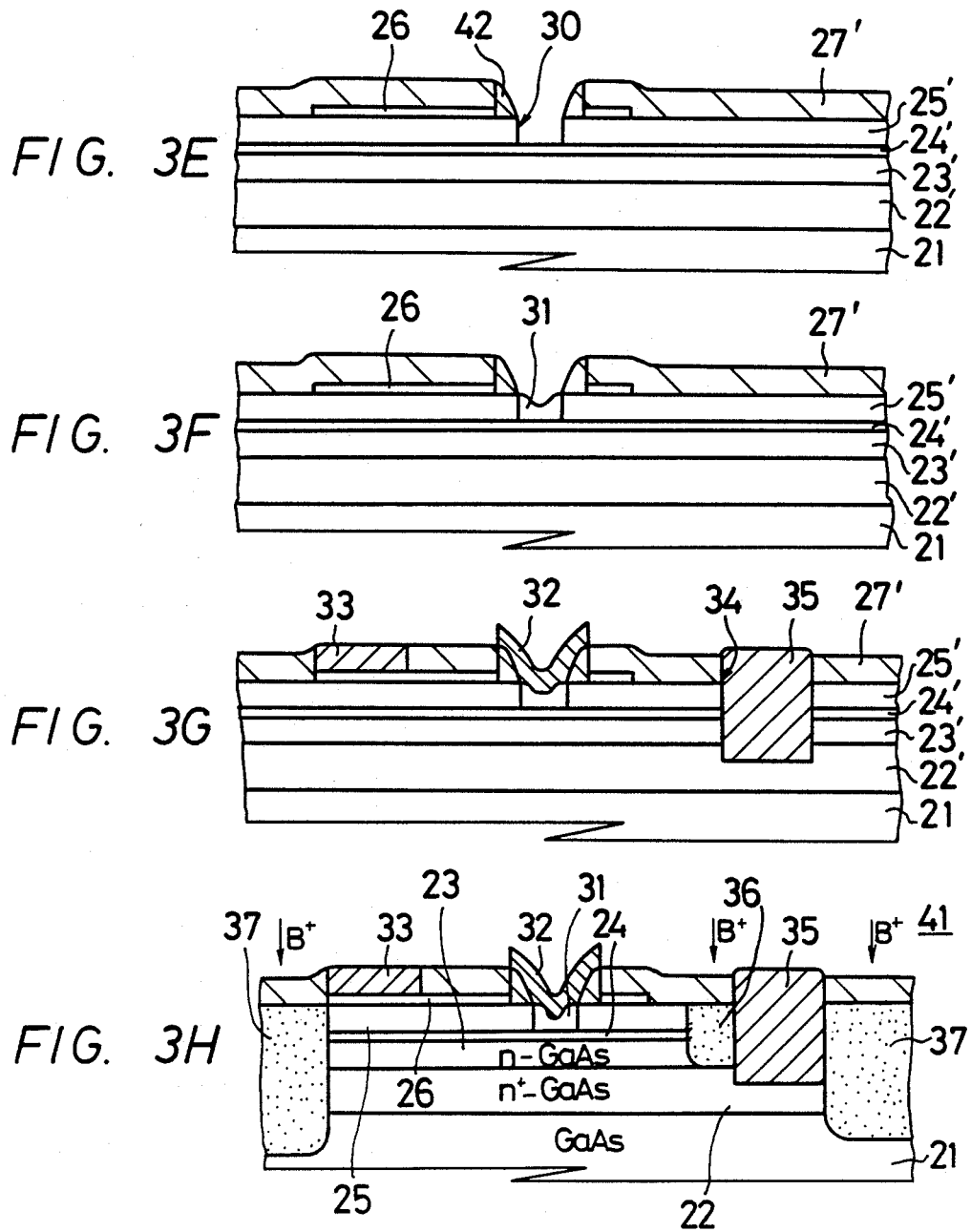

METHOD OF MANUFACTURING A HETEROJUNCTION BIPOLAR TRANSISTOR

BACKGROUND OF THE INVENTION

1. Field of the Invention

This invention relates to a method of manufacturing heterojunction bipolar transistors.

2. Description of the Prior Art

With the recent progress of the epitaxial techniques for III-V group compound semiconductors, particularly AlGaAs compound semiconductors, heterojunction devices have already been made. An example of such a device is an AlGaAs/GaAs double heterojunction semiconductor laser which is manufactured by a liquid phase epitaxial growth (LPE) technique. There have been developed techniques for manufacturing the above-mentioned devices such as a vapor-phase growth method and molecular-beam epitaxy method which permit production of devices which require abruptness of a hetero interface. These devices include a high electron mobility transistor (HEMT) and a heterojunction bipolar transistor (HBT) according to the present invention.

The heterojunction bipolar transistor is a type which can overcome defects of a monojunction bipolar transistor made, e.g., of silicon or the like. To specifically explain the advantage of, for example, a heterojunction type transistor using AlGaAs for its emitter (E) and GaAs for its base (B) and collector (C), the hole or the majority carrier in the base cannot be diffused into the emitter due to an energy barrier produced by a band gap difference ($\Delta E_g$) between E and B, so that the base current is decreased and the injection efficiency of electrons from the emitter to the base in increased. It is therefore possible to increase the amplification degree ($\beta = I_C/I_B$) even though the base concentration is set at a high value and the emitter concentration at a low value. This means that the base resistance and the capacitance between E and B, which relate to the operating speed of the device, can be decreased. It has been theoretically and experimentally shown that the heterojunction bipolar transistor can operate at a higher speed than a silicon bipolar transistor.

The structure of the heterojunction bipolar transistor can take the form of a mesa type as shown in FIG. 1 or a planar type as shown in FIG. 2.

Referring to FIG. 1, a mesa type bipolar transistor 1 is formed of a conductive layer made of n+-GaAs with a thickness of 5000 Å, i.e., a collector electrode leading layer 3, a collector region 4 made of n-GaAs with a thickness of 3000 Å, a base region 5 made of p-GaAs with a thickness of 1000 Å, an emitter region 6 made of n-AlGaAs with a thickness ranging from 1000 to 1500 Å, and a cap layer 7 made of n+-GaAs with a thickness ranging from 500 to 1000 Å successively deposited on a semi-insulating GaAs substrate 2. Reference numeral 8 designates a base electrode, 9 an emitter electrode, 10 a collector electrode and 12 an external base layer.

The mesa type bipolar transistor 1 has a portion of the external base layer 12 and a part of the collector electrode leading layer 3 exposed by etching, on the surfaces of which the electrodes 8 and 10 are directly deposited. An isolation between elements is also carried out by etching to the depth of the substrate 2. Reference numeral 11 designates an insulating layer made, e.g. of SiO$_2$ or the like. The mesa type transistor is advantageous in that a single element for experimental use can be manufactured in a shorter time period and with less processing. However, it provides some problems in practical manufacturing, e.g., as follows:

1. It is difficult to expose the external base layer by etching with good reproducibility;

2. When the isolation between elements is carried out, there is a possibility that wiring is cut at the edge of the stage in the case of a one-stage mesa structure. If a plurality of small stages is formed in place of one stage so as to prevent the cutting at edges, it entails an increase in device size.

3. There is the same problem as to the formation of an electrode on the collector electrode leading layer.

Therefore, the so-called planar type transistor, which has a plane surface to solve the above-mentioned problems inherent in the mesa type transistor, is an indispensable structure for practical semiconductor integrated circuits (IC).

FIG. 2 shows a typical structure of an AlGaAs/GaAs planar heterojunction bipolar transistor manufactured by ion implantation and metal burying technologies. An example of a manufacturing process of a transistor 17 having such a structure will be brfiefly explained as follows.

As shown in FIG. 2, on a semi-insulating GaAs substrate 2, there are epitaxially deposited successively an n+-GaAs layer which is to serve as a collector electrode leading layer 3, an n-GaAs layer which is to serve as a collector region 4, a p-GaAs layer which is to serve as a base region 5, an n-AlGaAs layer which is to serve as an emitter region 6, and n-GaAs and n+-GaAs layers which are to serve as a cap layer 7. Then, the cap layer 7 made of n+-GaAs except the portion which will become the emitter region 6 is removed by etching. Next, Mg is implanted with a resist or an SiO$_2$ layer 11 used as a mask, and thereafter an external base layer 12 is formed by annealing. Further, an element isolation region 13 and a base/collector isolation region 14 are formed by implanting B+ or H+ ions thereinto. Finally, a portion of the SiO$_2$ layer 11 over the collector electrode forming layer is removed to form an opening, a trench (groove portion) 15 is formed, and a metal is buried into the trench 15, to thereby manufacture the transistor 17.

The planar transistor has excellent features in comparison with the mesa transistor as described above. However, conventional methods of manufacturing planar transistors still provide the following problems:

Since the external base region is formed by implanting Mg ions and annealing, the contact resistance and the sheet resistance of the external base region cannot be sufficiently reduced. Further, since the external base region is formed by implanting Mg ions, the emitter concentration of n-AlGaAs and GaAs cannot be made high, because then the emitter resistance becomes high. Further, there occurs a problem in controlling the minute emitter area due to diffusion of Mg. It is therefore difficult to obtain homogeneity in such devices, resulting in scattering of characteristics among such devices.

SUMMARY OF THE INVENTION

In view of the above-mentioned problems, it is an object of the present invention to provide a method of manufacturing heterojunction bipolar transistors having a high speed operation property and good homogeneous characteristics.

According to one aspect of the invention, there is provided a method of manufacturing a heterojunction bipolar transistor in which a collector region, a base region and an emitter region are successively formed on a compound semiconductor substrate, the method comprising the steps of:

forming a concave portion in an electrode leading region of the base region; and forming an emitter region within the concave portion and in contact with the base region.

These and other objects, features and advantages of the present invention will become apparent from the following detailed description of the preferred embodiments taken in conjunction with the accompanying drawings, throughout which like reference numerals designate like elements and parts.

DESCRIPTION OF THE PREFERRED EMBODIMENTS

Now, an embodiment of the present invention will hereinafter be described with reference to FIGS. 3A–3H.

Figure 1:
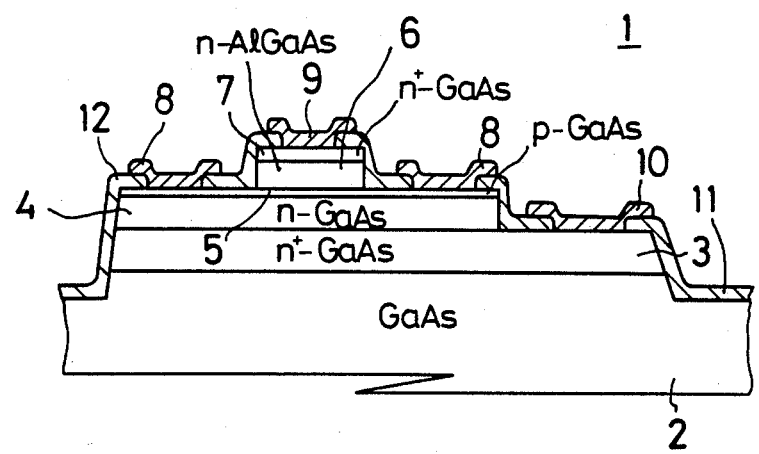
FIG. 1 is a cross-sectional view showing an example of a conventional mesa transistor.
Figure 2:
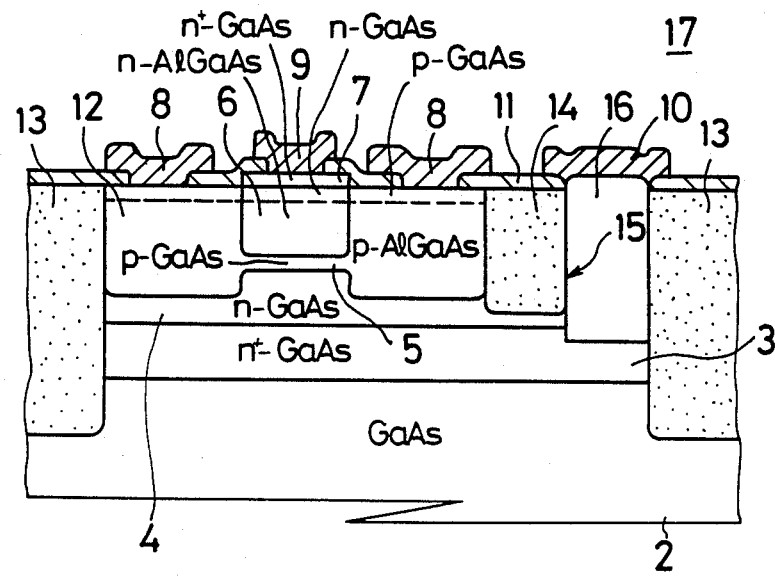
FIG. 2 is a cross-sectional view showing an example of a conventional planar transistor.
Figure 3A:
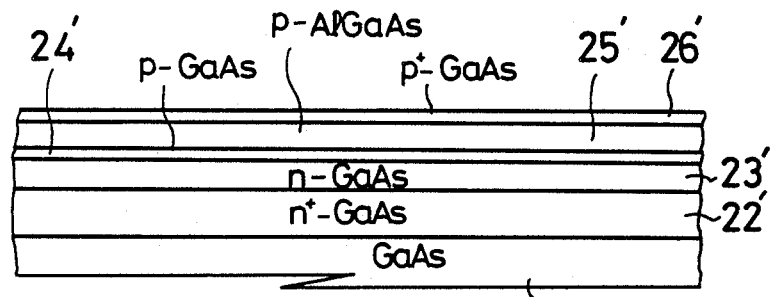
FIGS. 3A and 3H are diagrams showing manufacturing steps of an embodiment according to the present invention.

Referring first to FIG. 3A, on a semi-insulating GaAs substrate 21 there are successively deposited by a metal organic vapor deposition (MOCVD) or molecular beam epitaxy (MBE) method an n+-GaAs layer 22' ($3 \times 10^{18}$ cm$^{-3}$, thickness : 0.5 um) which is to serve as a collector electrode leading layer 22, an n-GaAs layer 23' ($10^{17}$ cm$^{-3}$, thickness : 0.3 um) which is to serve as a collector region 23, a p-GaAs layer 24' ($3 \times 10^{18}$ cm$^{-3}$, thickness : 0.1 um) which is to serve as a base region 24, a p-AlGaAs layer 25' ($3 \times 10^{18}$ cm$^{-3}$, thickness : 0.3 um) which is to serve as a base electrode leading region, that is, an external base layer 25, and a p+-GaAs layer 26' ($10^{19}$ cm$^{-3}$, thickness : 0.1 um) which is to serve as a base cap layer 26.

Figure 3B:
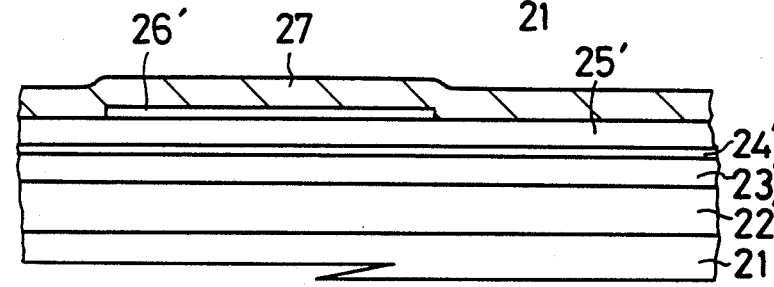

Next, as shown in FIG. 3B, the p+-GaAs layer 26' is selectively etched away in a manner that its portions corresponding to the external base region and the emitter forming region are left, and thereafter an SiO$_2$ layer 27 having a thickness of 0.3 um is deposited over the surface by CVD (chemical vapor deposition) or a sputtering method.

Figure 3C:
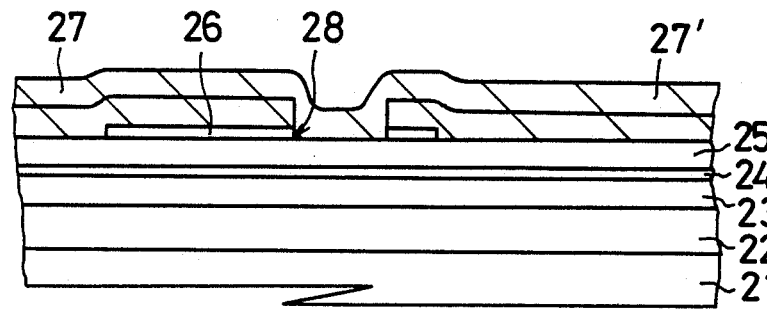

Then, as shown in FIG. 3C, the p+-GaAs layer 26' and the SiO$_2$ layer 27 on the emitter forming region are selectively removed by etching to form an opening 28, and thereafter and SiO$_2$ layer 27 having a thickness of 0.3 um is formed thereover by CVD or a sputtering method. Now, the base cap layer 26 is formed by this selective etching.

Figure 3D:
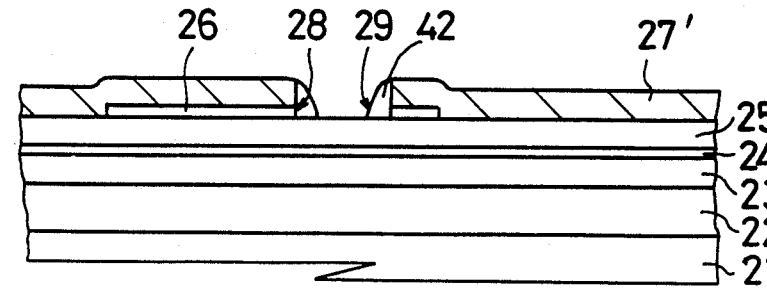

Next, as shown in FIG. 3D, the SiO$_2$ layer 27 in the opening 28 is etched away be reactive ion etching (RIE) so as to expose a portion of the p-AlGaAs layer 25' corresponding to the emitter forming region. In this etching process, on the side face of the opening 28, there remains an SiO$_2$ side wall 42 having a width of about 0.3 um so that a new opening 29 which has an emitter length reduced by approximately 0.6 um is produced.

Next, as shown in FIG. 3E, the p-AlGaAs layer 25' is etched by the RIE with the SiO$_2$ layer 27 as a mask to such an extent that the p-GaAs layer 24' is exposed, to thereby form a concave portion 30 on the p-AlGaAs layer 25'.

Further, as shown in FIG. 3F, compound semiconductors are selectively grown again in the concave portion 30 by the MOCVD method with the result that, n-AlGaAs ($5 \times 10^{17}$ cm$^{-3}$, thickness : 1000 Å) and n+-GaAs ($5 \times 10^{18}$ cm$^{-3}$, thickness : 500 Å) are epitaxially grown in turn to a total thickness of 1500 Å to form an emitter region 31. In this epitaxial growth, on the SiO$_2$ layer 27 in the vicinity of the concave portion 30 the compound semiconductor is rarely grown. However, although on its region more than about 50 um away from the concave portion 30, there is grown a bit of compound semiconductor, this can be easily removed afterward by the use of an etching liquid including sulfuric acid.

Next, as shown in FIG. 3G, after an emitter electrode 32 is formed on the emitter region 31 by the usual process, an opening is made through the SiO$_2$ layer 27 on the base cap layer 26 to form a base electrode 33. Then, an opening is made through the SiO$_2$ layer 27 on the collector electrode forming portion, a bore 34, the depth of which is 0.8–1.0 um, is made, and thereafter a metal (AuGe) is buried into the bore 34 to form a collector electrode 35 which is in ohmic contact with the collector electrode leading layer 22.

Finally, B+ or H+ ions are implanted to form an isolation region 36 between the base and the collector and an isolation region 37 between the elements to thereby define the base layer 24, the collector region 23, the external base layer 25 and the collector electrode leading layer 22. Thus, a heterojunction bipolar transistor 41 according to the present embodiment is completed, as shown in FIG. 3H.

According to the above described manufacturing method, in the process of FIGS. 3E and 3F, the concave portion 30 is formed on the external base layer 25, making use of the side wall 42 arranged in the opening 28 of the SiO$_2$ layer 27, and the emitter region 31 is selectively epitaxially grown in the concave region 30, so that the length of the emitter region 31 can be decreased to a length shorter by a portion of the SiO$_2$ side wall 42 than a length determined by photolithography. Assuming that a 1 um lithography ruler is used, the emitter length can be decreased to less than 0.5 um. It is therefore possible to manufacture a heterojunction bipolar transistor having a size which could not be available by the conventional manufacturing methods. Further, the side wall of the emitter region can be formed by p-Al$_x$Ga$_{1-x}$As with being more than 0.4 so that a large barrier against electrons can be formed, whereby the implanted electrons can efficiently flow into the base region 24 arranged directly beneath the emitter region. As described above, the regions are formed in two epitaxial growth processes. More specifically, the collector electrode leading layer 22, the collector region 23, the base region 24 and the external base layer 25 are formed in the first epitaxial growth process and the emitter region 31 in the second epitaxial growth process. Therefore, it is possible to dope into the external base layer 25 impurities in a high concentration, which cannot be carried out by ion implantation techniques. Also, the doping concentration of the base cap layer 26 can be raised to $10^{19}$ cm$^{-3}$ or more, by which the base resistance can largely be reduced. Further, as an n$^+$-GaAs cap layer in the emitter region 31 can be heavily doped, the emitter resistance is reduced. Since the transistor manufactured by the method according to the present invention has a substantially perfect planar structure surface, cutting of the interconnection wire will not occur. Furthermore, the respective regions are formed in the two epitaxial growth processes, which can eliminate a conventionally required annealing process for ion implantation and ion activation, so that the devices have homogeneous characteristics.

Figure 4:
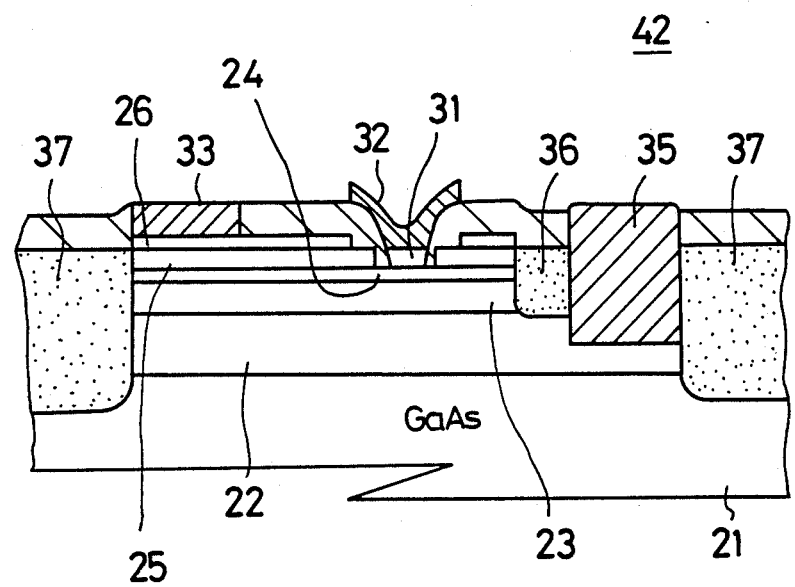
FIG. 4 is a cross-sectional view showing another embodiment of the present invention.

In the above described bipolar transistor 41, the emitter region 31 is in contact with the external base layer 25 made of AlGaAs, so that a portion of the holes at the side of the external base layer 25 flows into the emitter region 31 by a forward bias. This phenomenon can constitute a cause of reducing the current gain $I_C/I_B$. Then, to solve this problem, after the process shown in FIG. 3D is completed, the process of FIG. 3E is modified as follows:

First, the concave portion 30 is formed by etching the external base layer 25 and then SiO$_2$ is again deposited over the surface to a thickness of approximately 1500 Å. Next, the SiO$_2$ layer just formed is etched by the RIE technique. By this manufacturing process, SiO$_2$, the width of which is approximately 1000 Å, remains on the side wall of the concave portion 30 formed on the external base layer 25, so that the concave portion 30 is reduced. After the process of FIG. 3E modified as above is completed, the same processes as those of FIGS. 3F–3H are effected to thereby manufacture a bipolar transistor 42 according to a second embodiment of the present invention as shown in FIG. 4.

According to the second embodiment of the invention, the size of the emitter region 31 can be made far smaller (about 0.3 um) than the smallest size carried out by photolithography. Another advantage obtained by the second embodiment is that since the external base layer 25 and the emitter region 31 are perfectly isolated from each other by SiO$_2$, the current gain $I_C/I_B$ can be increased.

As described above, according to the present invention, since the emitter region is epitaxially deposited in the concave portion formed on the electrode leading region of the base region, the emitter region can be produced with a good controllability. Further, the respective regions are all formed by epitaxial growth, without a conventionally required thermal activation process for ion implantation, so that the external base layer and the emitter cap layer can be respectively made with a high concentration, to thereby reduce the base resistance and emitter resistance. Furthermore, the devices evidence homogeneous characteristics. It is therefore understood that the heterojunction bipolar transistor according to the present invention has highly improved characteristics in comparison with bipolar transistors according to conventional manufacturing methods and is preferable in use for an IC for very high speed digital operations.

The above description is given on a single preferred embodiment of the invention but it will be apparent that many modifications and variations could be effected by one skilled in the art without departing from the spirit or scope of the novel concepts of the invention so that the scope of the invention should be determined by the appended claims only.

I claim as my invention:

1. A method of manufacturing a heterojunction bipolar transistor which comprises:
   providing a compound semiconductor substrate,
   successively forming a collector region and a base region having an electrode leading region on said substrate,
   forming a concave portion in said electrode leading region, and
   forming an emitter region within said concave portion and in contact with said base region.

2. A method according to claim 1 in which said emitter region is formed by epitaxial growth.

3. A method according to claim 1 which includes a step of forming an insulating layer between said emitter region and said base region.

4. A method according to claim 2 wherein said emitter region is formed by chemical vapor deposition, followed by epitaxial growth.

5. A method according to claim 1 wherein the length of said emitter region is less than 0.5 um.

* * * * *